United States Patent
Lee et al.

(10) Patent No.: US 7,061,029 B1
(45) Date of Patent: Jun. 13, 2006

(54) HIGH-VOLTAGE DEVICE STRUCTURE

(75) Inventors: Wen-Fang Lee, Hsin-Chu (TW);
Wei-Lun Hsu, Hsin-Chu Hsien (TW);
Yu-Hsien Lin, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/906,570

(22) Filed: Feb. 24, 2005

(51) Int. Cl.
*H01L 29/745* (2006.01)

(52) U.S. Cl. .................. 257/213; 257/347; 257/358; 257/361; 257/363; 257/379; 257/546; 257/757; 438/183; 438/151; 438/165; 438/200; 438/275; 357/42

(58) Field of Classification Search ........... 257/213, 257/347, 358, 361, 363, 379, 546, 757; 438/183, 438/151, 165, 200, 275; 357/42
See application file for complete search history.

(56) References Cited

U.S. PATENT DOCUMENTS

| 5,061,981 A | * | 10/1991 | Hall | 257/370 |
| 5,801,426 A | * | 9/1998 | Okamura | 257/386 |
| 5,990,522 A | * | 11/1999 | Okamura | 257/371 |
| 6,265,251 B1 | * | 7/2001 | Jun et al. | 438/183 |
| 2002/0060343 A1 | * | 5/2002 | Gauthier et al. | 257/363 |
| 2003/0102513 A1 | * | 6/2003 | Gauthier et al. | 257/379 |

* cited by examiner

*Primary Examiner*—Dung Le
*Assistant Examiner*—Tram H. Nguyen
(74) *Attorney, Agent, or Firm*—Winston Hsu

(57) ABSTRACT

A high-voltage device structure disposed in a substrate of a first conductivity type includes a first well and a second well each of a second conductivity type, a source diffusion region and a drain diffusion region each of a first length located in the first well and the second well respectively, and a gate of a second length on the substrate surface. Since the gate of the second length is longer than the source diffusion region and the drain diffusion region of the first length, the two sides of the gate have two spare regions. Two windows are located in the spare regions.

18 Claims, 4 Drawing Sheets

HIGH-VOLTAGE DEVICE STRUCTURE

BACKGROUND OF INVENTION

1. Field of the Invention

The present invention relates to a high-voltage device structure, and more particularly, to a high-voltage device structure capable of suppressing parasitic currents.

2. Description of the Prior Art

In the past few years, accompanying the great expansion of electronic communication products, for example mobile phones, drivers of liquid crystal displays (LCDs) have come to be especially important. Products manufactured by a high-voltage process technology such as 32 V and 0.18 micrometer products are developed to be applied to the field of portable single chip thin film transistor (TFT) LCDs and so forth. A distinguishing feature of this technology is that different voltages are supplied to gate drivers, source drivers and controllers so that devices are able to be embedded in static random access memory (SRAM) for manufacturing smaller chips.

Please refer to FIG. 1. FIG. 1 is a plan view schematically illustrating a high-voltage device structure 10 according to the prior art. As shown in FIG. 1, a high-voltage device structure 10 disposed in a P-type substrate (not shown in FIG. 1) includes a first N-well 12 (indicated by the dashed line in FIG. 1), a second N-well 14 (indicated by the dashed line in FIG. 1), a channel diffusion region 16 (indicated by the dashed line in FIG. 1) connecting portions of the first N-well 12 and the second N-well 14, and a poly-silicon gate 18 covering the channel diffusion region 16. The high-voltage device structure 10 further includes a source diffusion region 20 located in the first N-well 12, a drain diffusion region 22 located in the second N-well 14, and a shallow trench isolation 24 located in the P-type substrate to properly isolate the source diffusion region 20, the drain diffusion region 22, and the channel diffusion region 16. The source diffusion region 20, the drain diffusion region 22, and the poly-silicon gate 18 are electrically connected with external circuits (not shown in FIG. 1) through contact plugs 26, 28, 30, 32, and 34.

For preventing a current leakage phenomenon in corners of the channel diffusion region 16, the high voltage device structure 10 is improved according to the prior art to let the length of the channel diffusion region 16 be longer than the length of the source diffusion region 20 and the drain diffusion region 22. Spaces where the channel diffusion region 16 is longer than the source diffusion region 20 and the drain diffusion region 22 form two spare regions 36 and 38. However, recent devices are smaller and smaller so that a lot of parasitic currents are generated in the spare regions 36 and 38, which have high gate voltages, to cause unpredictable I–V characteristic curves.

SUMMARY OF INVENTION

It is therefore a primary objective of the present invention to provide a high-voltage device structure to solve the above problems.

According to the above objective, a preferred embodiment of the present invention discloses a high-voltage device structure disposed in a substrate of a first conductivity type, which includes a first well and a second well each of a second conductivity type located in the substrate, a source diffusion region and a drain diffusion region each of a first length located in the first well and the second well respectively, and a gate of a second length located on a surface of the substrate. The gate of the second length is longer than the source diffusion region and the drain diffusion region of the first length to form two spare regions in two sides of the gate. The present invention further includes a gate oxide layer located on the substrate surface covered by the gate, a channel diffusion region located in the substrate covered by the gate and located on a portion of the first well and the second well, at least a shallow trench isolation located in the substrate to isolate the source diffusion region, the drain diffusion region and the channel diffusion region, and two windows located in the two spare regions respectively. The two windows expose a portion of the gate oxide layer.

The high-voltage device structure of the present invention includes the two windows in the spare regions of the two sides of the gate. The high-voltage device structure is capable of suppressing parasitic current generated in the spare regions and has the advantage of utilizing the longer channel diffusion region to prevent current a leakage phenomenon in corners of the channel diffusion region. Therefore, the present invention is favorable for manufacturing small high-voltage devices.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
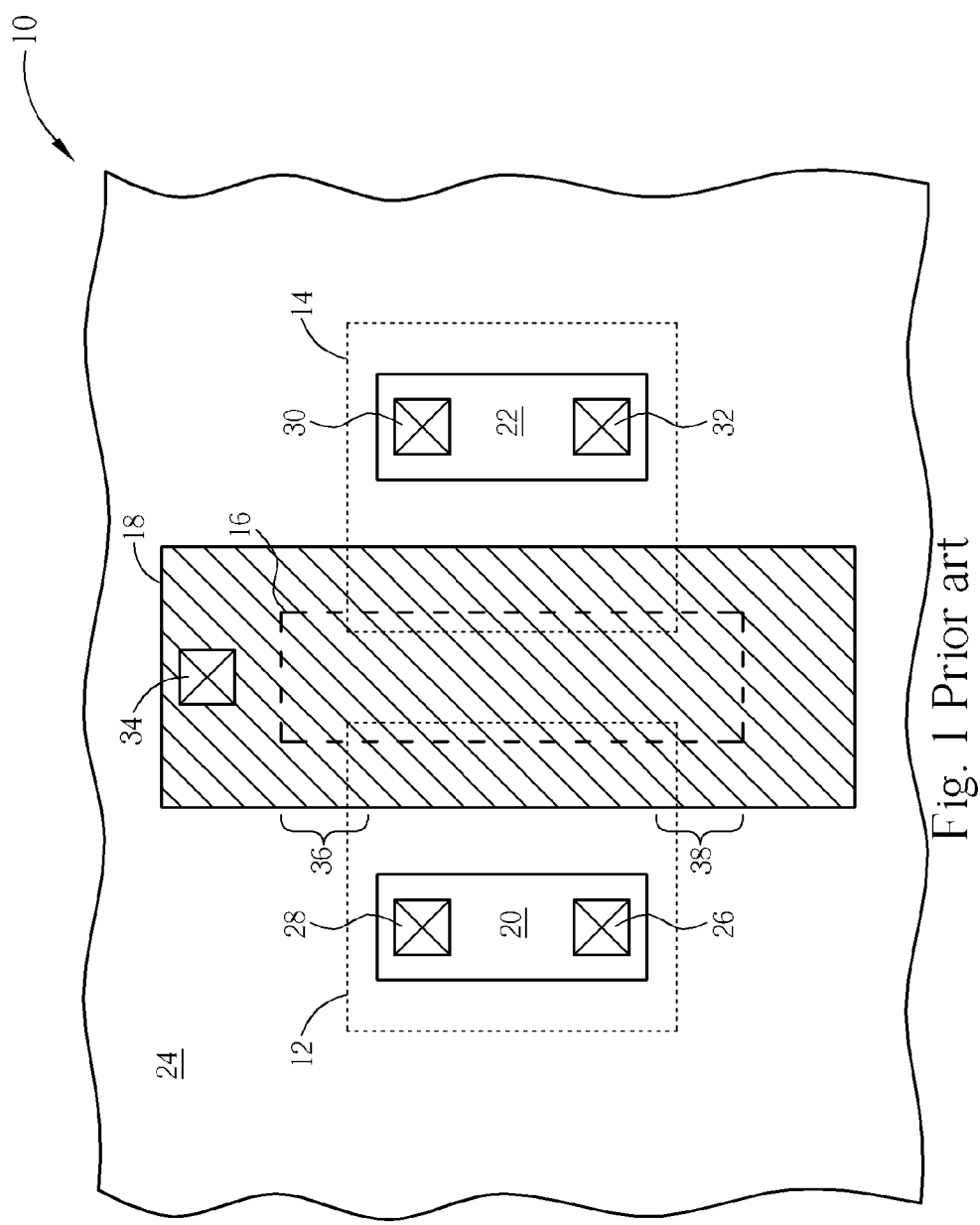
FIG. 1 is a plan view schematically illustrating a high-voltage device structure according to the prior art.
Figure 2:
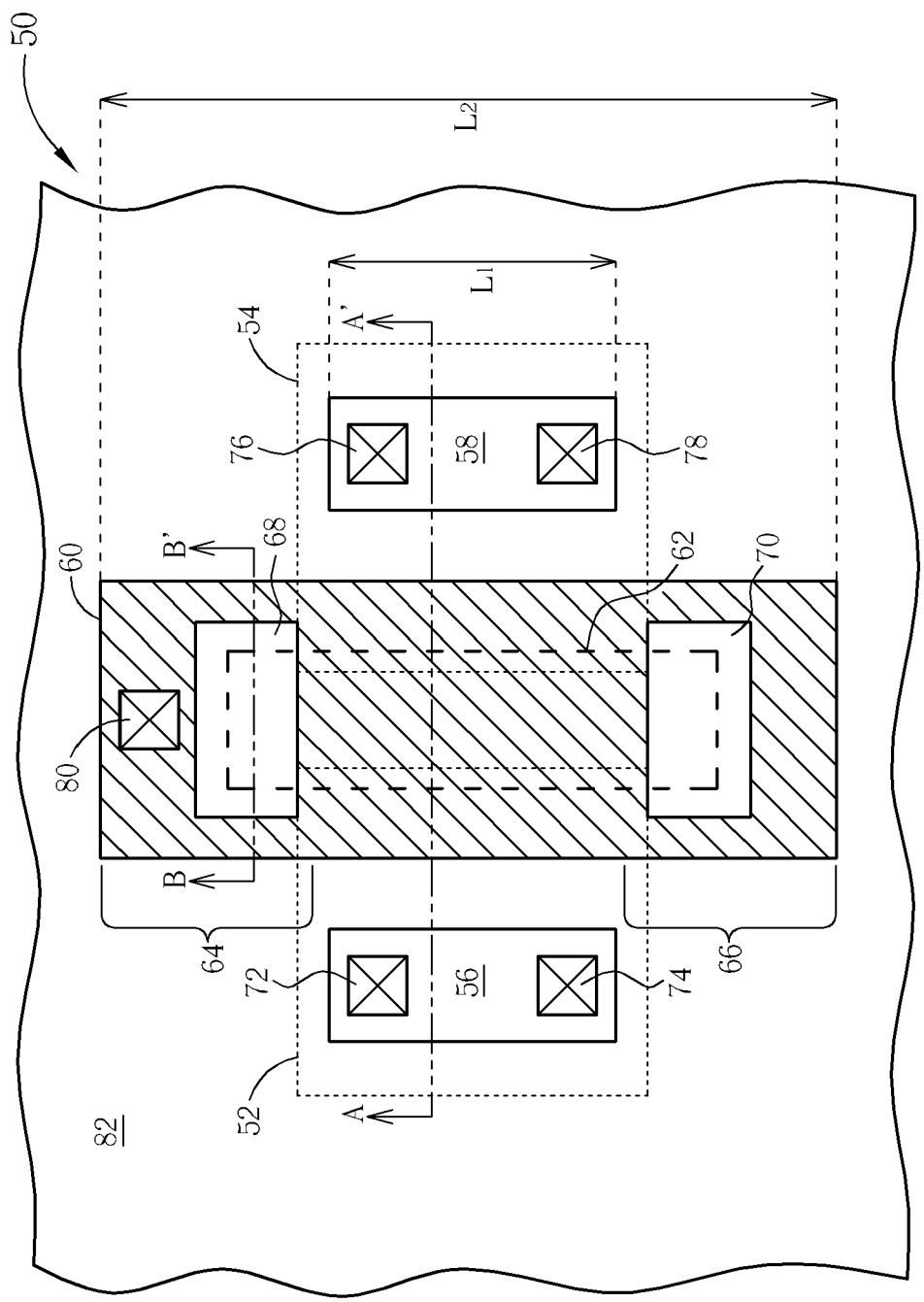
FIG. 2 is a plan view schematically illustrating a high-voltage device structure according to the present invention.

Please refer to FIG. 2. FIG. 2 is a plan view schematically illustrating a high-voltage device structure 50 according to the present invention. As shown in FIG. 2, a high-voltage device structure 50 disposed in a substrate (not shown in FIG. 2) of a first conductivity type includes a first well 52 (indicated by the dashed line in FIG. 2) and a second well 54 (indicated by the dashed line in FIG. 2) of a second conductivity type located in the substrate, a source diffusion region 56 and a drain diffusion region 58 of a first length $L_1$ located in the first well 52 and the second well 54 respectively, a gate 60 of a second length $L_2$ located on a surface of the substrate, a channel diffusion region 62 (indicated by the dashed line in FIG. 2) located in the substrate covered by the gate 60 and on a portion of the first well 52 and the second well 54, and a gate oxide layer (not shown in FIG. 2) located on the substrate surface covered by the gate 60. The first conductivity type is P-type and the second conductivity type is N-type. The high-voltage device structure 50 is located in the P-type substrate and includes the N-type first well 52 and second well 54. Equivalently, the first conductivity type is N-type and the second conductivity type is P-type. Then, the high-voltage device structure 50 is located in the N-type substrate and includes the P-type first well 52 and second well 54. Regardless of the conductivity types selected, the gate 60 consists of poly-silicon, a double-layer structure of poly-silicon, a compound of metal and poly-silicon, or similar.

The second length $L_2$ mentioned above is longer than the first length $L_1$ so that the gate 60 is longer than the source diffusion region 56 and the drain diffusion region 58 to form two spare regions 64 and 66 in two sides of the gate 60. The spare regions 64 and 66 include two windows 68 and 70 to expose a portion of the gate oxide layer. According to the present invention, the windows 68 and 70 are formed when the gate 60 is defined. The channel diffusion region 62 is longer than the source diffusion region 56 and the drain diffusion region 58 so that the high-voltage device structure 50 is able to prevent the current leakage phenomenon in corners of the channel diffusion region 62.

The high-voltage device structure 50 of the present invention further includes contact plugs 72, 74, 76, 78, and 80 located on the source diffusion region 56, the drain diffusion region 58, and the spare region 64 of the gate 60 respectively to electrically connect with external circuits (not shown in FIG. 2), and at least a shallow trench isolation 82 located in the substrate to isolate the source diffusion region 56, the drain diffusion region 58, and the channel diffusion region 62.

Figure 3:
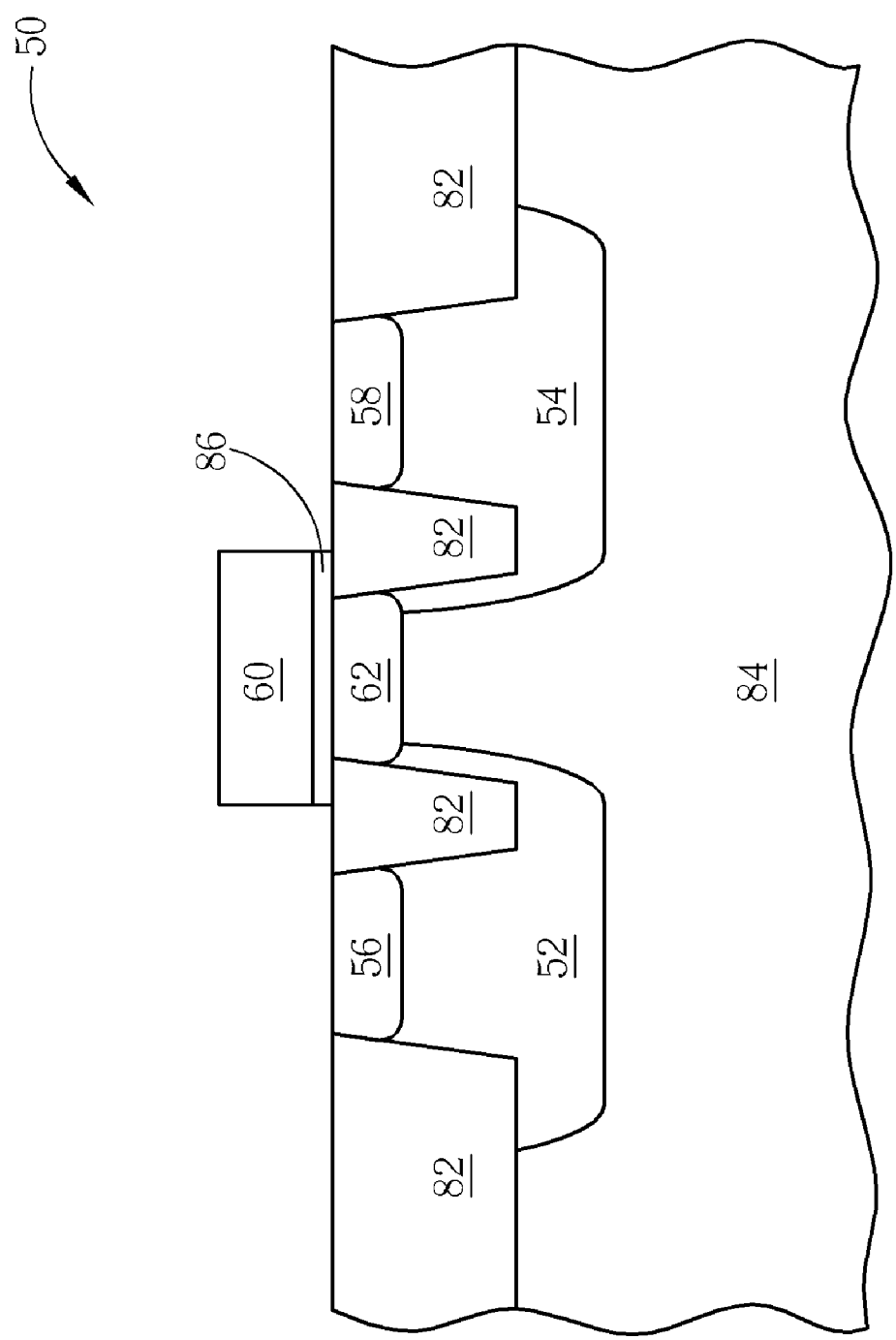
FIG. 3 is a schematic, cross-sectional view of the high-voltage device structure of FIG. 2 along line A–A'.
Figure 4:
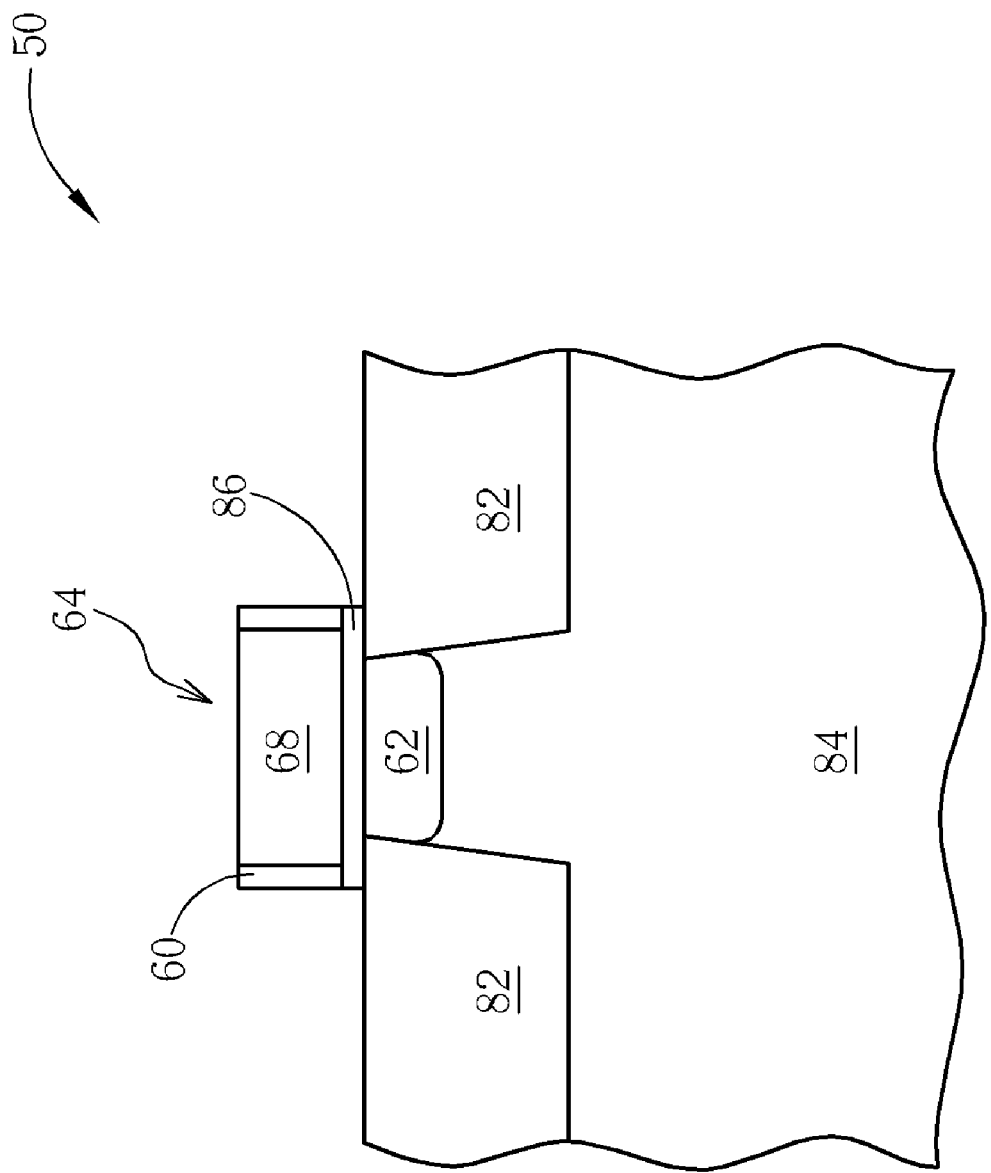
FIG. 4 is a schematic, cross-sectional view of the high-voltage device structure of FIG. 2 along line B–B'.

For illustrating the high-voltage device structure 50 of the present invention more clearly, please refer to FIG. 3 and FIG. 4. FIG. 3 is a schematic, cross-sectional view of the high-voltage device structure 50 of FIG. 2 along line A–A'. FIG. 4 is a schematic, cross-sectional view of the high-voltage device structure 50 of FIG. 2 along line B–B'. As shown in FIG. 3, the high-voltage device structure 50 located in the substrate 84 of the first conductivity type includes the first well 52 and the second well 54 of the second conductivity type located in the substrate 84, the source diffusion region 56 and the drain diffusion region 58 located in the first well 52 and the second well 54 respectively, the gate 60 located on the substrate 84 surface, the channel diffusion region 62 located in the substrate 84 covered by the gate 60 and on a portion of the first well 52 and the second well 54, the gate oxide layer 86 located between the gate 60 and the substrate 84 surface, and the shallow trench isolation 82 located in the substrate 84 to isolate the source diffusion region 56, the drain diffusion region 58, and the channel diffusion region 62.

As shown in FIG. 4, the spare region 64 of the gate 60 includes the window 68 to expose a portion of the gate oxide layer 86. The gate 60 covers the channel diffusion region 62 located in the substrate 84, and the substrate 84 includes the shallow trench isolation 82.

Compared to the prior, the high-voltage device structure 50 of the present invention includes the two windows 68 and 70 in the spare regions 64 and 66 of the two sides of the gate 60. The high-voltage device structure 50 is capable of suppressing a parasitic current generated in the spare regions 64 and 66 and has the advantage of utilizing the longer channel diffusion region 62 to prevent the current leakage phenomenon in corners of the channel diffusion region 62. Therefore, the present invention is favorable for manufacturing small high-voltage devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage device structure, which is disposed in a substrate of a first conductivity type, comprising:
    a first well and a second well each of a second conductivity type located in the substrate;
    a source diffusion region and a drain diffusion region each of a first length located in the first well and the second well respectively;
    a gate of a second length located on a surface of the substrate, wherein the gate of the second length is longer than the source diffusion region and the drain diffusion region of the first length to form two spare regions in two sides of the gate;
    a channel diffusion region located in the substrate covered by the gate; and
    two windows located in the spare regions of the gate.

2. The high-voltage device structure of claim 1, wherein the first conductivity type is P-type, and the second conductivity type is N-type.

3. The high-voltage device structure of claim 1, wherein the first conductivity type is N-type, and the second conductivity type is P-type.

4. The high-voltage device structure of claim 1, wherein the gate consists of poly-silicon.

5. The high-voltage device structure of claim 1, wherein the channel diffusion region is located on a portion of the first well and the second well.

6. The high-voltage device structure of claim 1 further comprising a gate oxide layer located on the substrate surface covered by the gate.

7. The high-voltage device structure of claim 6, wherein the windows expose a portion of the gate oxide layer.

8. The high-voltage device structure of claim 1 further comprising a contact plug located on the spare regions of the gate.

9. The high-voltage device structure of claim 1 further comprising at least a contact plug located on the source diffusion region.

10. The high-voltage device structure of claim 1 further comprising at least a contact plug located on the drain diffusion region.

11. The high-voltage device structure of claim 1 further comprising at least a shallow trench isolation located in the substrate to isolate the source diffusion region, the drain diffusion region and the channel diffusion region.

12. A high-voltage device structure, which is disposed in a substrate of a first conductivity type, comprising:
    a first well and a second well each of a second conductivity type located in the substrate;
    a source diffusion region and a drain diffusion region each of a first length located in the first well and the second well respectively;
    a gate of a second length located on a surface of the substrate, wherein the gate of the second length is longer than the source diffusion region and the drain diffusion region of the first length to form two spare regions in two sides of the gate;
    a gate oxide layer located on the substrate surface covered by the gate;
    a channel diffusion region located in the substrate covered by the gate and on a portion of the first well and the second well;
    at least a shallow trench isolation located in the substrate to isolate the source diffusion region, the drain diffusion region and the channel diffusion region; and
    two windows located in the spare regions of the gate and exposing a portion of the gate oxide layer respectively.

13. The high-voltage device structure of claim 12, wherein the first conductivity type is P-type, and the second conductivity type is N-type.

14. The high-voltage device structure of claim 12, wherein the first conductivity type is N-type, and the second conductivity type is P-type.

15. The high-voltage device structure of claim 12, wherein the gate consists of poly-silicon.

16. The high-voltage device structure of claim 12 further comprising a contact plug located on the spare regions of the gate.

17. The high-voltage device structure of claim 12 further comprising at least a contact plug located on the source diffusion region.

18. The high-voltage device structure of claim 12 further comprising at least a contact plug located on the drain diffusion region.

* * * * *